United States Patent
Akiyama et al.

(10) Patent No.: US 8,878,237 B2
(45) Date of Patent: Nov. 4, 2014

(54) ACTIVE EDGE STRUCTURES PROVIDING UNIFORM CURRENT FLOW IN INSULATED GATE TURN-OFF THYRISTORS

(71) Applicant: Pakal Technologies LLC, San Francisco, CA (US)

(72) Inventors: Hidenori Akiyama, Miyagi Sendai (JP); Richard A. Blanchard, Los Altos, CA (US); Woytek Tworzydlo, Austin, TX (US)

(73) Assignee: Pakal Technologies LLC, San Francisco, CA (US)

( * ) Notice: Subject to any disclaimer, the term of this patent is extended or adjusted under 35 U.S.C. 154(b) by 0 days.

(21) Appl. No.: 13/953,366

(22) Filed: Jul. 29, 2013

(65) Prior Publication Data

US 2014/0034995 A1    Feb. 6, 2014

Related U.S. Application Data (60) Provisional application No. 61/678,724, filed on Aug. 2, 2012, provisional application No. 61/781,517, filed on Mar. 14, 2013, provisional application No. 61/678,729, filed on Aug. 2, 2012, provisional application No. 61/781,494, filed on Mar. 14, 2013.

(51) Int. Cl.
*H01L 29/66* (2006.01)
*H01L 29/745* (2006.01)
*H01L 29/06* (2006.01)

(52) U.S. Cl.
CPC ........ *H01L 29/7455* (2013.01); *H01L 29/0619* (2013.01)

USPC ..... 257/119; 257/107; 257/331; 257/E29.125; 257/E29.212

(58) Field of Classification Search
USPC ......... 257/107, 119, 147, 152, 153, 170, 330, 257/331, 332, 564, 566, E29.125, E29.196, 257/E29.211, E29.212, E29.213
See application file for complete search history.

(56) References Cited

U.S. PATENT DOCUMENTS

| | | | |
|---|---|---|---|
| 5,914,503 A * | 6/1999 | Iwamuro et al. | 257/133 |
| 7,638,839 B2 * | 12/2009 | Arai et al. | 257/331 |
| 7,705,368 B2 | 4/2010 | Rodov et al. | |
| 2013/0115739 A1 | 5/2013 | Akiyama et al. | |
| 2013/0175576 A1 | 7/2013 | Blanchard | |

* cited by examiner

*Primary Examiner* — Eduardo A Rodela
(74) *Attorney, Agent, or Firm* — Patent Law Group LLP; Brian D Ogonowsky (57) ABSTRACT

An insulated gate turn-off thyristor, formed as a die, has a layered structure including a p+ layer (e.g., a substrate), an n− layer, a p-well, vertical insulated gate regions formed in the p-well, and n+ regions between the gate regions, so that vertical NPN and PNP transistors are formed. The thyristor is formed of a matrix of cells. Due to the discontinuity along the edge cells, a relatively large number of holes are injected into the n− epi layer and drift into the edge p-well, normally creating a higher current along the edge and lowering the breakover voltage of the thyristor. To counter this effect, the dopant concentration of the n+ region(s) near the edge is reduced to reduce the NPN transistor beta and current along the edge, thus increasing the breakover voltage. Alternatively, a deep trench may circumscribe the edge cells to provide isolation from the injected holes.

19 Claims, 5 Drawing Sheets

ACTIVE EDGE STRUCTURES PROVIDING UNIFORM CURRENT FLOW IN INSULATED GATE TURN-OFF THYRISTORS

CROSS-REFERENCE TO RELATED APPLICATIONS

This application is based on provisional application Ser. No. 61/678,724, filed Aug. 2, 2012, by Hidenori Akiyama and Richard Blanchard, and based on provisional application Ser. No. 61/781,517, filed Mar. 14, 2013, by Hidenori Akiyama and Richard Blanchard, and based on provisional application Ser. No. 61/678,729, filed Aug. 2, 2012, by Richard Blanchard, Hidenori Akiyama, and Woytek Tworzydlo, and based on provisional application Ser. No. 61/781,494, filed Mar. 14, 2013, by Richard Blanchard, Hidenori Akiyama, and Woytek Tworzydlo, all provisional applications being assigned to the present assignee and incorporated herein by reference.

FIELD OF THE INVENTION

This invention relates to insulated gate turn-off thyristors (IGTOs) and, more particularly, to improving the uniformity of current flow over the thyristor area to maximize the breakover voltage.

BACKGROUND

Figure 1:
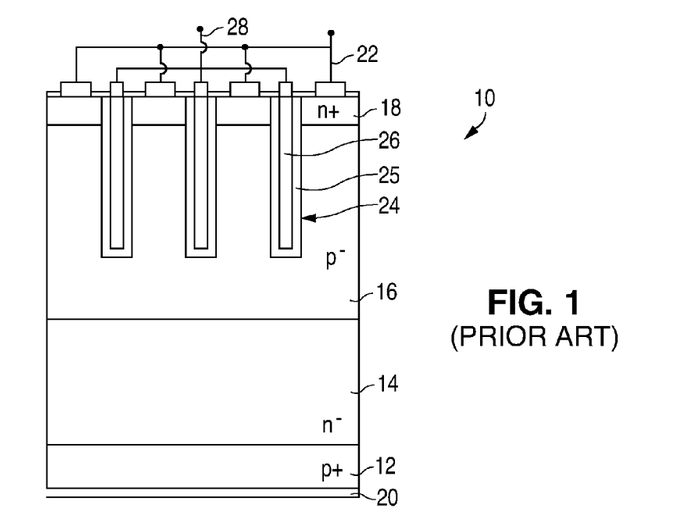
FIG. 1 is a cross-sectional view of a prior art insulated gate turn-off thyristor.

FIG. 1 is a cross-sectional view of a portion of a prior art insulated gate thyristor 10 described in U.S. Pat. No. 7,705,368, incorporated herein by reference. An NPNP semiconductor layered structure is formed. In FIG. 1, there is a PNP transistor formed by a p+ substrate 12, an n– epitaxial (epi) layer 14, and a p-well 16. There is also an NPN transistor formed by the layer 14, the p-well 16, and an n+ layer 18. A bottom anode electrode 20 contacts the substrate 12, and a cathode electrode 22 contacts the n+ layer 18. Trenches 24, coated with an oxide layer 25, contain a conductive gate material 26 (forming interconnected vertical gate regions) which is contacted by a gate electrode 28. The p-well 16 surrounds the gate structure, and the n– epi layer 14 extends to the surface around the p-well 16.

When the anode electrode 20 is forward biased with respect to the cathode electrode 22, but without a sufficiently positive gate bias, there is no current flow, since the product of the betas (gains) of the PNP and NPN transistors is less than one.

When the gate is forward biased, electrons from the n+ layer 18 become the majority carriers along the sidewalls and below the bottom of the trenches 24 in an inversion layer, causing the effective width of the NPN base (the portion of the p-well 16 below the trenches 24) to be reduced. As a result, the beta of the NPN transistor increases to cause the product of the betas to exceed one. This results in "breakover," when holes are injected into the lightly doped n– epi layer 14 and electrons are injected into the p-well 16 to fully turn on the thyristor. Accordingly, the gate bias initiates the turn-on, and the full turn-on is accomplished by the current flow through the NPN and PNP transistors.

When the gate bias is removed, the thyristor turns off.

Although not described in U.S. Pat. No. 7,705,368, the identical gate structure and p-well 16 shown in FIG. 1 may be repeated as an array of cells across the thyristor, and the various components may be connected in parallel so each cell conducts a small portion of the total current. The array (or matrix) of cells includes cells designed to be inner cells and cells designed to be edge cells.

Figure 2:
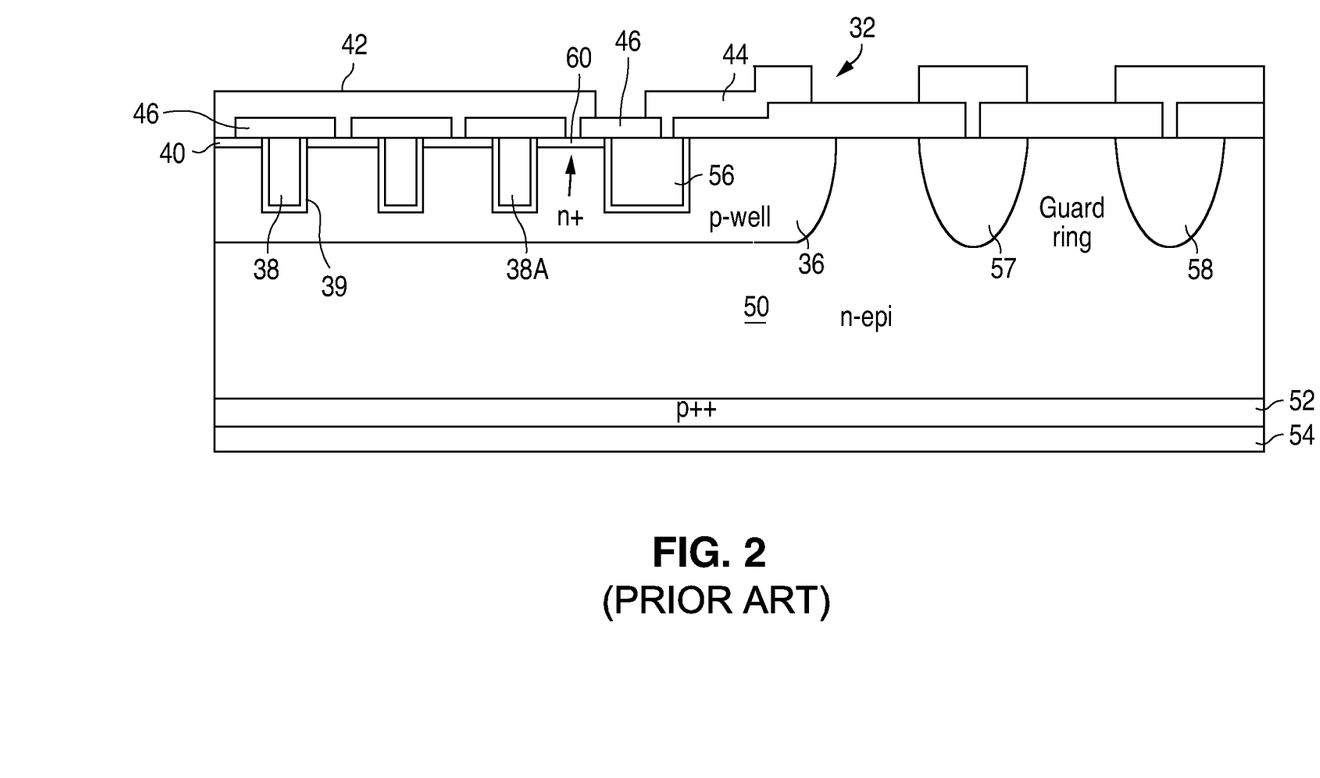
FIG. 2 is a cross-sectional view of an edge cell in Applicant's previous thyristor design, which the present invention improves.

FIG. 2 is a cross-section of a portion of an edge cell 32 of a thyristor described in Applicant's U.S. patent publication US 2013/0115739, incorporated herein by reference, filed on Oct. 10, 2012 and published on May 9, 2013. The principle of operation of the cell 32 is the same as that of FIG. 1. The edge cell 32 includes a p-well 36, insulated gate regions 38, an oxide layer 39 within the trenches, an n+ layer 40 between the gate regions 38, a cathode electrode 42, a gate electrode 44, and dielectric regions 46 patterned to insulate the metal from certain areas. The cells are formed in an n– epi layer 50 grown over a silicon p+ substrate 52. An anode electrode 54 contacts the substrate 52.

Figure 3:
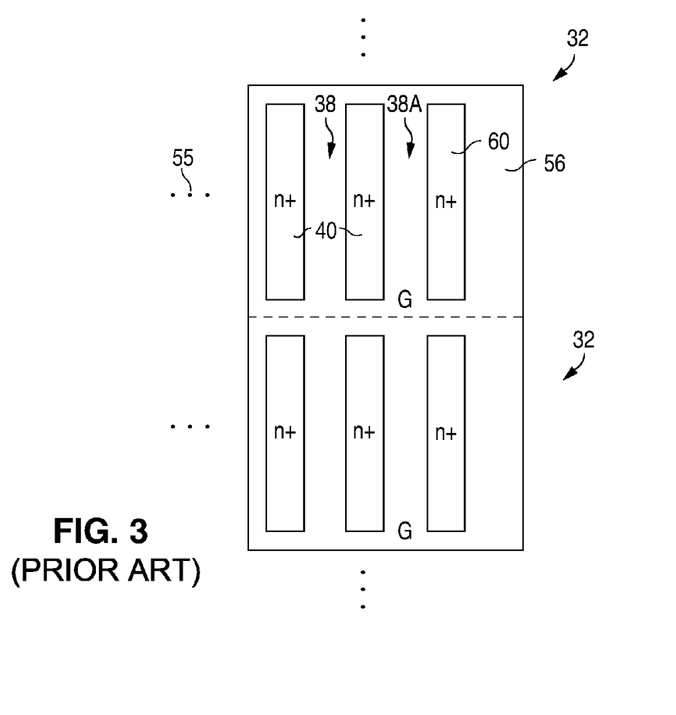
FIG. 3 is a simplified top down view of two edge cells in a thyristor, which are similar to the inner cells, in accordance with Applicant's previous design.

The thyristor is formed of many cells in a two-dimensional matrix of parallel-connected cells. FIG. 3 is a simplified top down view of two edge cells 32, where the edge cells form a perimeter around the inner cells and are substantially identical to the inner cells. The gate region of one inner cell continues across the cell boundary to the next inner cell or to an edge cell, so that, effectively, there is only one large gate in the thyristor. In one embodiment, there are between four to nine parallel trenches per cell. The continuation of the matrix in two-dimensions is represented by the ellipses 55. The right-most gate region 56 in FIG. 2 serves as an electrical connector between the gate electrode 44 and the other gate regions 38 in the thyristor. The gate region 56 is not surrounded by the n+ layer 40.

As shown in FIG. 2, the edge cells, unlike the "inner" cells, are next to p+ guard rings 57 and 58 formed in the n– epi layer 50, which reduce electric field crowding near the edges of the die to improve the breakdown voltage of the thyristor.

Since the cells are discontinuous at the edges, there are no emitters (n+ layer 40) in the p-base (p-well 36) on one side of the edge cells 32. Therefore, the edge cells 32 experience a different electrical environment compared to the "inner" cells. One difference is that, when the thyristor is forward biased and the gate voltage is below the threshold for turning on the thyristor, a relatively large number of holes, injected into the n– epi layer 50 (the base of the PNP transistor) from the p+ substrate 52, drift into the right side of the p-well 36. These holes drift to the nearest n+ region 60 next to gate 38A where they can contribute to the current flow and undesirably lower the breakover voltage of the thyristor. This breakover voltage is the forward voltage at which the thyristor turns on without any gate turn-on voltage. Ideally, the thyristor turn-on is solely controlled by the gate voltage and not the magnitude of the voltage applied to the anode and cathode electrodes. Therefore, having a high breakover voltage is desirable.

What is needed is an improvement of the thyristor shown in FIG. 1 or FIG. 2 which does not experience a decrease in breakover voltage due to the edge cells.

SUMMARY

In one embodiment, a thyristor die comprises a two-dimensional array of cells, including inner cells and edge cells. One or more guard rings may surround the array of cells between the array and the edge of the die.

In one example, each cell comprises a p-well formed in an n– epi layer, where the p-well acts as a base for a vertical NPN transistor, and the n– epi acts as a base for a vertical PNP transistor in an NPNP structure. Vertical insulated gate regions are formed in the p-well. Between the gate regions is formed a top n+ layer serving as an emitter (cathode) for the NPN transistors. The substrate is a p+ type and serves as an emitter (anode) for the PNP transistor. In an off-state, the p-well serves as a wide base for the NPN transistor, and the product of the betas of the NPN and PNP transistors is less than one. Therefore, there is no thyristor action, and substantially no current conduction between the anode and cathode. When a positive gate voltage is applied above a threshold, the p-well base has a reduced thickness caused by an inversion layer (electrons), causing the beta of the NPN transistor to increase and causing the product of the betas to be greater than one. As a result, there is thyristor action, and current is conducted between the anode and cathode.

All the inner cells are identical and have identical environments. The edge cells, however, have discontinuous environments and are subjected to a higher hole density in the n− epi next to the edge p-well. This condition increases the current in the p-well near the edge of the edge cells to cause the NPN emitter-base voltage to increase. This behavior would normally cause the thyristor to have a lower breakover voltage in the edge cells, causing an avalanche effect which, in turn, causes the thyristor to turn on prematurely when the forward voltage exceeds the breakover voltage, rather than being controlled by the gate voltage. To reduce the effect of the increased hole current density in the edge cells, the n+ layer (emitter) closest to the edge of each edge cell is formed to have a reduced dopant concentration profile that lowers the effective beta (and therefore the current) of the NPN transistor at the edge of the edge cells. (The term dopant concentration profile refers to the dopant concentration along a particular cross-section of the device.) This end n-type emitter (which is no longer a heavily doped n+ emitter) also conducts some current so the current is decreased for the other n+ emitters in the edge cell. Hence, the effect of the increased hole density is offset by the decreased beta and lowered current caused by the lighter doping of the n+ emitter of the NPN transistor at the edge.

Depending on the specific configuration of the thyristor, the n+ doping between additional gates in the edge cells may also be reduced to reduce the beta and current.

Further, not only is the breakover voltage in the edge cells made more equal to the breakover voltage of the inner cells, but the current conducted by the edge cells when the thyristor is on is made more equal to the current conducted by the inner cells, resulting in more uniform current flow over the entire area of the thyristor. This prevents thermal runaway, and provides other advantages.

In another embodiment, to prevent the non-uniform current flow and lowering of the breakover voltage due to the high hole density at the perimeter of the cell array, a deep insulating trench is formed extending from the surface of the thyristor to the p+ substrate around the cell array. This trench prevents holes that are present in the perimeter area from reaching the p-well (base of NPN transistor).

In another embodiment to reduce the current in the edge cells, some areas in the edge cells are not doped with an n-type dopant, so that those areas are not emitters and remain p-type, where the cathode electrode shorts the exposed p-well in those areas to the n+ emitters in other areas. The exposed p-well areas may be further doped to be p+ to provide a lower resistance ohmic contact to the cathode electrode. This concept may be extended to the inner cells to reduce the thermally-generated current in the NPN transistors when the thyristor is in an off state. The shorting may be in every cell or distributed around the thyristor.

Other embodiments are described.

BRIEF DESCRIPTION OF THE DRAWINGS

Elements that are similar or identical in the various figures are labeled with the same numeral.

DETAILED DESCRIPTION

Figure 4:
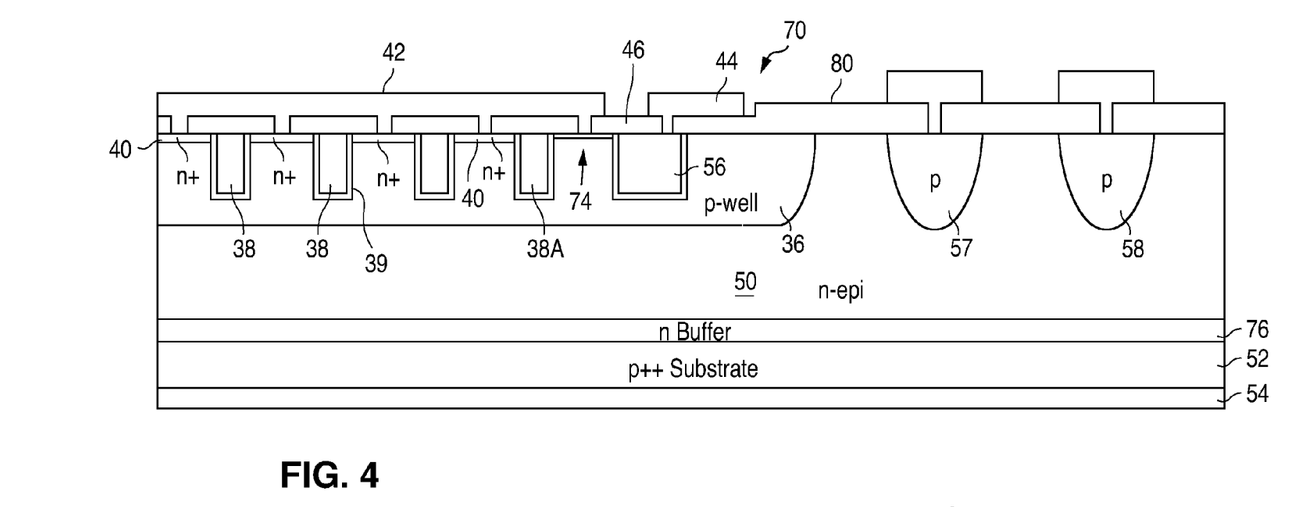
FIG. 4 illustrates an improvement to the edge cell of FIGS. 2 and 3 in accordance with one embodiment of the invention, where one or more n+ emitter regions are made more lightly doped.

FIG. 4 is a cross-sectional view that includes an edge cell 70 of a thyristor in accordance with one embodiment of the invention. The edge cells around the perimeter of the thyristor (between the inner cells and the edge of the die) may be identical. The inner cells are identical to one another and are different from the edge cells as described below. Elements that may be the same as in FIGS. 2 and 3 are similarly labeled and need not be described again.

One embodiment of the present invention reduces the beta (and thus the current) of the NPN transistor portion nearest the outer edge of the edge cells to prevent the high carrier density near the edge of the thyristor from lowering the breakover voltage of the thyristor.

To reduce the beta (and thus the current) of the NPN transistor portion forming the rightmost portion of the edge cell 70 in FIG. 4, the mask for the n+ layer 40 is altered to block the implantation of n-type dopants (phosphorus or arsenic) next to the rightmost gate region 38A at area 74 but allow implantation into the other areas between the gate regions 38. The blocking mask is then replaced after a time with a mask that allows implantation into all the areas between the gate regions 38, including area 74, so that there is a reduced n-type dopant concentration profile in area 74. In one embodiment, the n+ layer 40 is formed by an implant of arsenic or phosphorus at an energy of 10-150 keV and an area dose of $5 \times 10^{13}$ to $10^{16}$ cm$^{-2}$, to create a dopant concentration exceeding $10^{19}$ cm$^{-3}$. In one embodiment, the n+ layer 40 has a depth of 0.05-1.0 microns. In contrast, the area 74 has a reduced dosage, due to the implant recipe being different, to create an emitter with a peak n-type dopant concentration in the area 74 between about $10^{17}$ to $10^{19}$ cm$^{-3}$.

Since the beta of the NPN transistor that consists of the area 74 (acting as an emitter), the p-well 36 (acting as a base), and the n− epi 50 (acting as a collector) is very low, due to the n-type emitter having a lower peak n-type dopant concentration, there is less current that flows near the right edge of the edge cell 70 as a result of the high concentration of holes that enter the p-well 36 from the right edge of the edge cell 70. Further, the holes that remain become much more distributed as they drift further into the p-well 36, and their effect on the currents through the remaining n+ emitters (n+ layer 40) is not very significant. The dopant concentration profile of the n+ layer 40 may be further adjusted to grade the concentrations proportional to the distance from the edge of the p-well 36, or additional areas may be partially blocked from the n-type dopant implantation. In one embodiment, there may be 10 or more gate regions 38 in the edge cell 70, and the n-type dopant implant next to the first one, two, or three gate regions 38 is reduced to reduce the beta of the NPN transistors in those areas.

As a result of the reduced beta and resulting reduced current near the edge when the thyristor is off, the breakover voltage in that area is not significantly reduced. Therefore, the breakover voltage for the edge cell 70 is similar to the breakover voltage for the inner cells. Accordingly, the turn on and off of the thyristor can be solely controlled by the gate voltage.

In another embodiment, the implant into area 74 is totally blocked, and the diffusion of the holes in the p-well 36 have less effect on the current through the remaining n+ emitter regions.

Figure 5:
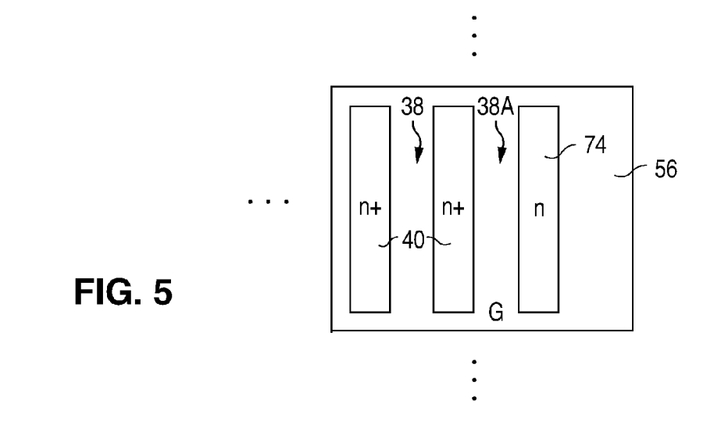
FIG. 5 is a top down view of the edge of the thyristor of FIG. 4 showing the reduction in dopant concentration of the n-type "emitter" area nearest the edge.

FIG. 5 is a simplified top down view of a portion of the edge cell 70, illustrating that the end "emitter" region at area 74 has a reduced dopant concentration profile or is undoped.

The inner cells may be identical to the edge cells 70 except the regions between the trenches are all heavily n-doped (by the n+ layer 40), and the trenches all have the same width.

Additionally, to reduce the injection of holes into the n− epi 50 from the p+ substrate 52 when the thyristor is off, an n-type buffer layer 76 is grown with a dopant concentration higher than that of the n− epi 50.

Further details of the fabrication of the thyristor are presented below.

The starting p+ substrate 52 may have a dopant concentration of $1\times10^{18}$ to $2\times10^{19}$ cm$^{-3}$.

The n-type buffer layer 76 is then grown to a thickness of 3-10 microns thick and has a dopant concentration between about $10^{17}$ to $5\times10^{17}$ cm$^{-3}$.

The n− epi 50 is grown to a thickness of 40-70 microns (for a 600V device) and has a doping concentration between about $5\times10^{13}$ to $5\times10^{14}$ cm$^{-3}$. This dopant concentration can be obtained by in-situ doping during epi growth.

Field oxide 80 is then grown to a thickness of, for example, 0.6-2 microns. LOCOS technology may be used. The active areas are defined using a mask if LOCOS technology is not used. Otherwise, the active areas are defined by the LOCOS oxide mask.

The p-well 36 is then formed by masking and boron dopant implantation. Preferably, some of the doping of the p guard rings 57 and 58 is performed in the same patterned implant. The peak doping in the p-well 36 can be, for example, $10^{16}$-$10^{18}$ cm$^{-3}$. The depth of the p-well 36 depends on the maximum voltage of the device and may be between 0.5-10 microns.

The two-stage masked implant is then used to create the n+ layer 40 and the reduced-concentration n− layer in area 74, as described above. The n+ layer 40 has a depth of, for example, 0.05-1.0 microns.

Either before or after the implant which forms the shallow n+ layer 40, trenches are etched in the active areas. In one embodiment, the trenches can be, for example, 1-10 microns deep, but the minimum lateral trench widths are constrained by lithographic and etching limitations.

After the trenches are etched, gate oxide 39 is grown on the sidewalls and bottoms of the trenches to, for example, 0.05-0.15 microns thick. Conductive material, such as heavily doped polysilicon, then fills the trenches and is planarized to form the gate regions in all the cells (including gate regions 38, 38A, and 56).

A contact mask opens the dielectric (e.g., oxide) layer 46 above the selected regions on the top surface to be contacted by metal electrodes. There may be multiple openings over each n+ emitter region for distributing current.

Various metal layers are then deposited to form the gate electrodes 44, the cathode electrode 42, and the anode electrode 54. The p+ substrate 52 may be thinned.

Figure 6:
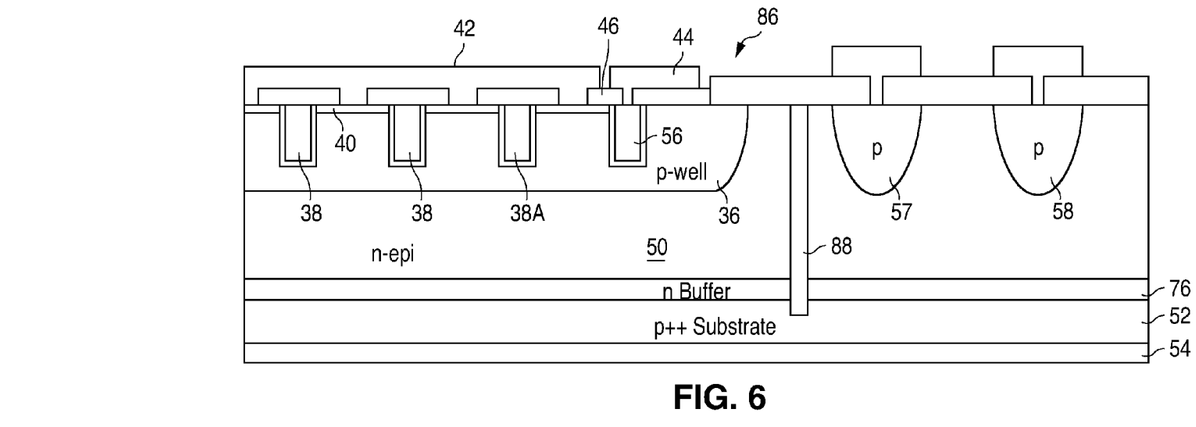
FIG. 6 illustrates an improvement to the edge cell of FIGS. 2 and 3 in accordance with another embodiment of the invention, where a deep trench extends down to the p+ substrate.
Figure 7:
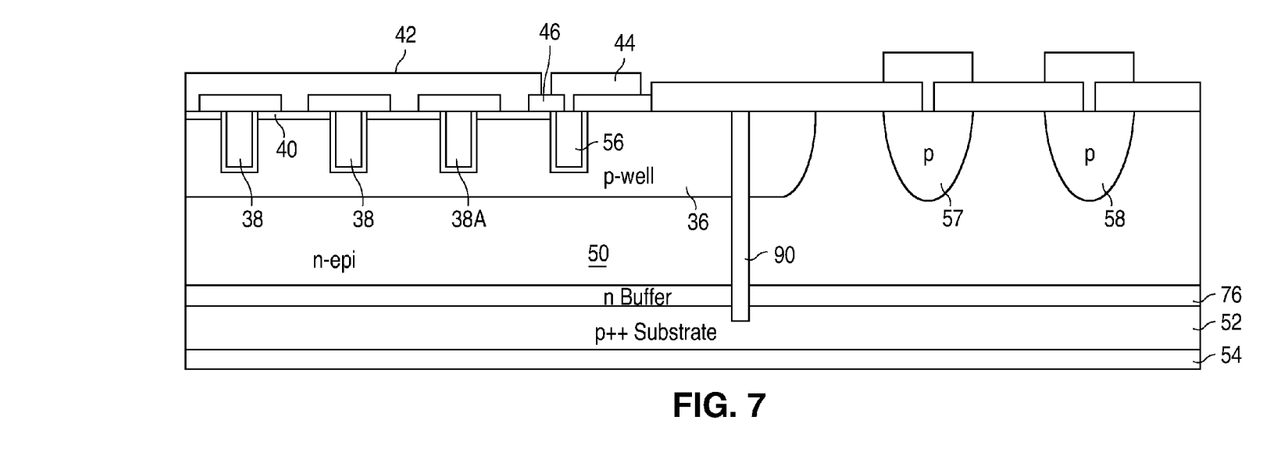
FIG. 7 illustrates an improvement to the edge cell of FIGS. 2 and 3 in accordance with another embodiment of the invention, where a deep trench cuts through the edge p-well and extends down to the p+ substrate.

FIGS. 6 and 7 illustrate an alternative way to reduce the number of holes injected into the n− epi 50 from drifting into the right edge of the p-well 36 of the edge cells 86. In this example, all of the n+ "emitter" areas (n+ layer 40) between the gate regions 38, 38A, and 56 are doped equally with the n-type dopant, so that the edge cells 86 are identical to the inner cells regarding the n+ emitters.

In FIG. 6, a deep trench 88 is etched outside the perimeter of the p-well 36, circumscribing the thyristor, which extends down into the p+ substrate 52. Accordingly, holes in the n− epi 50 outside of the trench 88 do not enter the p-well 36. The trench 88 may be formed using an additional masking and etching step either before or after the gate trenches have been formed.

In FIG. 7, the deep trench 90 extends through the edge of the p-well 36, where the right edge of the p-well 36 then serves as an additional p-type floating field ring to increase the breakdown voltage of the thyristor.

The trenches 88 and 90 may be filled with a dielectric or sealed at the top.

Figure 8:
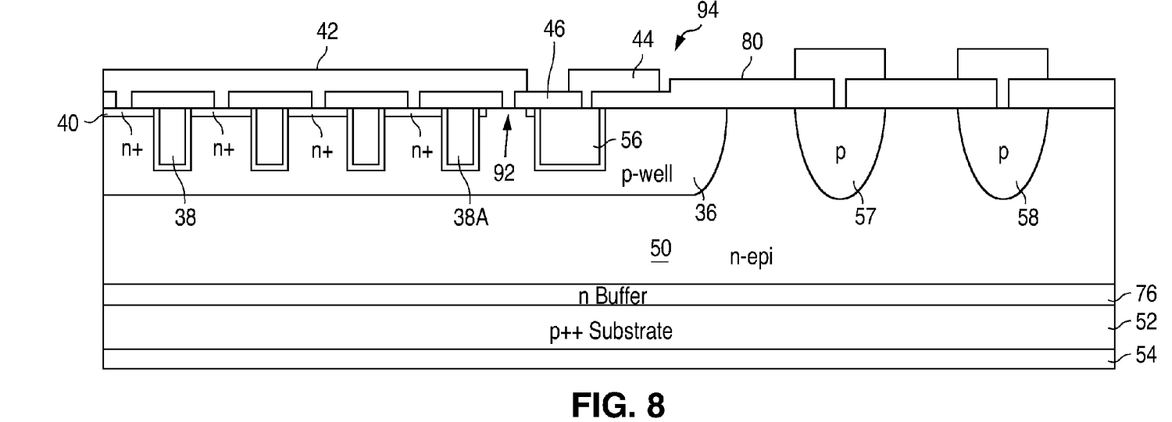
FIG. 8 illustrates another embodiment where one or more n-type emitter areas in the edge cell are not doped, so that those areas are not emitters and remain p-type, where the cathode electrode shorts the exposed p-well in those areas to the n+ emitters in other areas.

FIG. 8 illustrates another embodiment where one or more areas 92 between the gate regions in the edge cells 94 are not n-type, so that those areas 92 are not emitters and remain p-type, where the cathode electrode 42 shorts the exposed p-well 36 in those areas 92 to the n+ emitters (n+ layer 40) in other areas. A p+ implant into the areas 92 may be included to provide a low resistance ohmic connection between the cathode electrode 42 and the p-well 36. Any number of the n+ emitters, or areas of the n+ emitters, may be deleted to reduce the current in the edge cell 94. The shorting is a high resistance short between the p-well 36 and the n+ emitters between other gate regions, due to the relatively long distance between the shorted p-well area 92 and the n+ layer 40 created by the vertical trenches, so the n+ layer 40 can still be forward biased with respect to the p-well 36.

Figure 9:
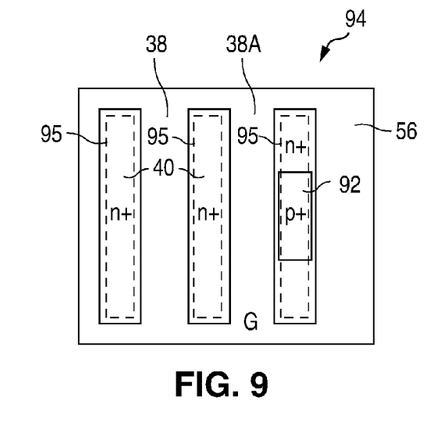
FIG. 9 is a simplified top down view of an edge cell like that of FIG. 8, showing a p+ area within an n+ emitter for being shorted by the cathode electrode.

FIG. 9 is a simplified top down view of a portion of the edge cell 94 of FIG. 8 showing that the rightmost "emitter" area includes the area 92 that is p-type, for enabling shorting of the p-well 36 to the n+ layer 40. The openings 95 in the dielectric layer 46 (defined by a metal layer mask) identify where the cathode electrode 42 contacts the n+ layer 40 and p-type area 92. Although the p-type area 92 is shown within an n+ layer 40, the entire area between the gate regions (in the channel area) may be p-type for shorting the channel area along its entire length.

Additionally, by providing this short, thermally generated carriers in the p-well 36 that would normally create a leakage current are removed by the short so as to bypass the emitter-base junction (the n+ layer 40/p-well 36 junction) of the NPN transistor. Therefore, there is less chance of the thyristor turning on due to such leakage currents. The size and distribution of these shorting regions will determine the low current performance of the thyristor.

The resulting current gain of the NPN transistor at the edge of the active area is very low for low collector currents (since some of the current bypasses the emitter-base junction). The current gain is much higher once the collector current is sufficiently large to generate a voltage of at least the Vbe of the NPN transistor.

Figure 10:
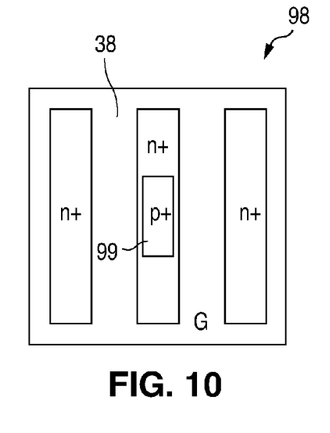
FIG. 10 is a simplified top down view of an inner cell showing the p+ area formed in a central area of the cell for being shorted to the n+ emitter by the cathode electrode.

The concept of FIG. 8 may be extended to even the inner cells to reduce the effects of the leakage current. For example, the top down view of FIG. 10 shows one or more of the n+ emitter areas (or areas within an n+ emitter) in an inner cell 98. being p-type and shorted by the cathode electrode. An additional p-type implant is made to form the p+ contact area 99. Accordingly, the n-dopant implant mask and the p-type dopant mask may be designed to control the n-type and p-type dopant concentration profile of the emitter areas in both the edge cells and the inner cells, depending on the effects of the leakage current, over the entire area of the thyristor. This may be determined by simulation. The edge cells may have the same p+ pattern as the inner cell 98.

Figure 11:
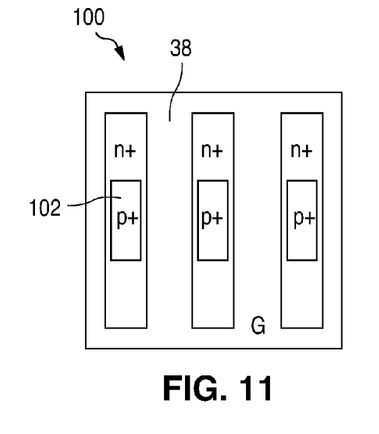
FIG. 11 is a simplified top down view of an inner cell showing the p+ area formed in a portion of all the n+ emitter areas for being shorted by the cathode electrode.

FIG. 11 illustrates that all the n+ emitter areas in an inner cell 100 may include a p+ contact area 102 for the shorting. The edge cells may have the same p+ pattern as the inner cell 100.

In one embodiment, all cells include at least one p+ contact area for shorting to the n+ emitters. In another embodiment, only some of the cells include the p+ contact area for shorting to the n+ emitters, depending on the effectiveness of the shorting in limiting the leakage current.

The various polarities shown may be reversed for an oppositely configured thyristor.

Trenches and gate regions may extend below the p-well 36 into the n− epi 50 to create a different type of transistor, such as an insulated gate bipolar transistor, and the present invention equally applies to the edge cells in such a structure to increase the breakover voltage of the edge cells.

The p+ substrate 52 may be any p+ layer that is formed, and the original substrate may be removed. Accordingly, the substrate 52 may be also referred to as a "layer," whether it is a substrate or a formed layer on which the anode electrode 54 is deposited. Similarly, the implanted or diffused p-well 36 may be a p-type epitaxial layer doped during growth, where the term "layer" describes both the well and the epitaxial layer.

It is also possible to use an n-type lightly doped starting wafer and form a p+ layer (substituting for the p+ substrate 52) and the n-type buffer layer 76 by implantation and diffusion.

Additional detail regarding the fabrication of the various regions and trenches may be found in the above-identified documents incorporated herein by reference.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An insulated gate turn-off thyristor formed as a die comprising:
    a first semiconductor layer of a first conductivity type;
    a second semiconductor layer of a second conductivity type;
    a third semiconductor layer of the first conductivity type;
    a matrix of cells comprising inner cells and edge cells, wherein each of the inner cells and each of the edge cells comprises a plurality of insulated gate regions within trenches formed at least within the third semiconductor layer;
    wherein, in the inner cells, a fourth semiconductor layer of the second conductivity type is formed in first areas between the gate regions near a top surface of the third semiconductor layer, the fourth semiconductor layer having a first concentration profile of dopants of the second conductivity type, wherein a vertical structure of NPN and PNP transistors is formed, and conduction between the first semiconductor layer and the fourth semiconductor layer is controlled by a voltage applied to the gate regions; and
    wherein, in at least some of the edge cells, the fourth semiconductor layer having the first concentration profile of dopants of the second conductivity type is not formed in a second area between the gate regions nearest to an outer edge of the edge cells, so as to reduce a current flow near the outer edge of the edge cells,
    wherein the gate regions do not extend below the third semiconductor layer.

2. The thyristor of claim 1 wherein the second area contains a second concentration profile of dopants of the second conductivity type, and wherein the second concentration profile is less than the first concentration profile but greater than zero.

3. The thyristor of claim 1 wherein the second area is the first conductivity type and has a dopant concentration profile higher than a dopant concentration profile in the third semiconductor layer.

4. The thyristor of claim 1 wherein the first semiconductor layer is a substrate.

5. The thyristor of claim 1 wherein the third semiconductor layer is a well.

6. The thyristor of claim 1 where the second area is a first conductivity type within at least one of the first areas of the second conductivity type.

7. The thyristor of claim 1 wherein the first semiconductor layer acts as an emitter for the PNP transistor, the second semiconductor layer acts as a base for the PNP transistor and a collector for the NPN transistor, the third semiconductor layer acts as a base for the NPN transistor and a collector for the PNP transistor, and the fourth semiconductor layer acts as an emitter for the NPN transistor.

8. An insulated gate turn-off thyristor formed as a die comprising:
    a first semiconductor layer of a first conductivity type;
    a second semiconductor layer of a second conductivity type;
    a third semiconductor layer of the first conductivity type;
    a matrix of cells comprising inner cells and edge cells, wherein each of the inner cells and each of the edge cells comprises a plurality of insulated gate regions within trenches formed at least within the third semiconductor layer;
    wherein, in the inner cells, a fourth semiconductor layer of the second conductivity type is formed in first areas between the gate regions near a top surface of the third semiconductor layer, the fourth semiconductor layer having a first concentration profile of dopants of the second conductivity type, wherein a vertical structure of NPN and PNP transistors is formed, and conduction between the first semiconductor layer and the fourth semiconductor layer is controlled by a voltage applied to the gate regions; and wherein, in at least some of the edge cells, the fourth semiconductor layer having the first concentration profile of dopants of the second conductivity type is not formed in a second area between the gate regions nearest to an outer edge of the edge cells, so as to reduce a current flow near the outer edge of the edge cells, wherein, in at least some of the inner cells, the fourth semiconductor layer having the first concentration profile of dopants of the second conductivity type is not formed at least in a third area between the gate regions, so as to reduce a current flow through the at least some of the inner cells.

9. An insulated gate turn-off thyristor formed as a die comprising:
a first semiconductor layer of a first conductivity type;
a second semiconductor layer of a second conductivity type;
a third semiconductor layer of the first conductivity type;
a matrix of cells comprising inner cells and edge cells, wherein each of the inner cells and each of the edge cells comprises a plurality of insulated gate regions within trenches formed at least within the third semiconductor layer;
wherein, in the inner cells and the edge cells, a fourth semiconductor layer of the second conductivity type is formed in first areas between the gate regions near a top surface of the third semiconductor layer, wherein a vertical structure of NPN and PNP transistors is formed, and conduction between the first semiconductor layer and the fourth semiconductor layer is controlled by a voltage applied to the gate regions; and
an electrically insulating first trench extending down to the first semiconductor layer between an outer gate region in the edge cells so as to circumscribe the gate regions in the matrix of cells.

10. The thyristor of claim 9 wherein the first trench cuts through a portion of the third semiconductor layer.

11. The thyristor of claim 9 wherein the first trench circumscribes the third semiconductor layer.

12. The thyristor of claim 9 wherein the first semiconductor layer acts as an emitter for the PNP transistor, the second semiconductor layer acts as a base for the PNP transistor and a collector for the NPN transistor, the third semiconductor layer acts as a base for the NPN transistor and a collector for the PNP transistor, and the fourth semiconductor layer acts as an emitter for the NPN transistor.

13. The thyristor of claim 9 wherein the gate regions do not extend below the third semiconductor layer.

14. An insulated gate turn-off thyristor formed as a die comprising:
a first semiconductor layer of a first conductivity type;
a second semiconductor layer of a second conductivity type;
a third semiconductor layer of the first conductivity type;
a matrix of cells comprising inner cells and edge cells, wherein each of the inner cells and each of the edge cells comprises a plurality of insulated gate regions within trenches formed at least within the third semiconductor layer;
wherein, in the inner cells and the edge cells, a fourth semiconductor layer of the second conductivity type is formed in first areas between the gate regions near a top surface of the third semiconductor layer, wherein a vertical structure of NPN and PNP transistors is formed, and conduction between the first semiconductor layer and the fourth semiconductor layer is controlled by a voltage applied to the gate regions;
wherein, in at least some of the cells, at least one second area between the gate regions is not a second conductivity type but is part of the third semiconductor layer of the first conductivity type; and
a metal electrode electrically contacting the fourth semiconductor layer in the first areas and the third semiconductor layer in the second area to short the first areas to the second area,
wherein the gate regions do not extend below the third semiconductor layer.

15. The thyristor of claim 14 wherein the at least some of the cells comprises the edge cells.

16. The thyristor of claim 14 wherein the at least some of the cells comprises the inner cells.

17. The thyristor of claim 14 wherein the second area is additionally doped with first conductivity type dopants to improve electrical contact between the third semiconductor layer and the metal electrode.

18. The thyristor of claim 14 wherein the at least some of the cells comprises cells distributed over the thyristor.

19. The thyristor of claim 14 wherein the first semiconductor layer acts as an emitter for the PNP transistor, the second semiconductor layer acts as a base for the PNP transistor and a collector for the NPN transistor, the third semiconductor layer acts as a base for the NPN transistor and a collector for the PNP transistor, and the fourth semiconductor layer acts as an emitter for the NPN transistor.

* * * * *